United States Patent [19]

Takahashi et al.

[11] Patent Number: 4,893,556
[45] Date of Patent: Jan. 16, 1990

[54] SCREEN PRINTER WITH DOUBLE DOCTOR/SQUEEGEE, PRINTING PRESSURE SENSOR AND ALIGNING MECHANISM

[75] Inventors: Tetsuo Takahashi; Akio Sasaki; Kunio Mogi; Hajime Shimazaki; Masakazu Hasegawa, all of Akita, Japan

[73] Assignee: TDK Corporation, Japan

[21] Appl. No.: 155,152

[22] Filed: Feb. 10, 1988

[30] Foreign Application Priority Data

Feb. 23, 1987 [JP] Japan .................................. 62-37899
Feb. 23, 1987 [JP] Japan .................................. 62-37900
Feb. 25, 1987 [JP] Japan .................................. 62-40149

[51] Int. Cl.$^4$ ............................................. B41F 15/42
[52] U.S. Cl. .................................... 101/123; 101/481
[58] Field of Search ............... 101/123, 129, 124, 126, 101/120, DIG. 12, 481

[56] References Cited

U.S. PATENT DOCUMENTS

| | | | |
|---|---|---|---|
| 1,922,710 | 8/1933 | Owens | 101/123 |
| 3,459,125 | 8/1969 | Forslund | 101/123 X |
| 3,587,458 | 6/1971 | Feier et al. | 101/120 X |
| 3,735,730 | 5/1973 | Mitter | 101/120 X |
| 4,040,352 | 8/1977 | Curti | 101/126 X |
| 4,463,673 | 8/1984 | Moore | 101/129 |
| 4,610,200 | 9/1986 | Metso | 101/126 |
| 4,782,751 | 11/1988 | Colapinto | 101/126 |

FOREIGN PATENT DOCUMENTS

| | | | |
|---|---|---|---|
| 137569 | 4/1985 | European Pat. Off. | 101/126 |
| 2232446 | 1/1975 | France | 101/126 |
| 12650 | 1/1982 | Japan | 101/123 |
| 709961 | 1/1980 | U.S.S.R. | 101/120 |
| 1031783 | 7/1983 | U.S.S.R. | 101/126 |
| 1306729 | 4/1987 | U.S.S.R. | 101/129 |

*Primary Examiner*—Clifford D. Crowder
*Attorney, Agent, or Firm*—Steinberg & Raskin

[57] ABSTRACT

A screen printing apparatus capable of uniformly applying a paste onto a screen to accomplish fining of a printed pattern and formation of a fined printed pattern. The apparatus includes a pair of laterally movable printing heads alternately actuated for printing and each including a doctor plate and a squeegee which are vertically movably arranged. The doctor plates of the printing heads being arranged laterally opposite to each other on the screen. The doctor plates each serve to apply a paste onto the screen while transferring the paste on the screen and the squeegees each act ot press the screen against a printed object after application of the paste onto the screen by the doctor plate corresponding thereto.

11 Claims, 14 Drawing Sheets

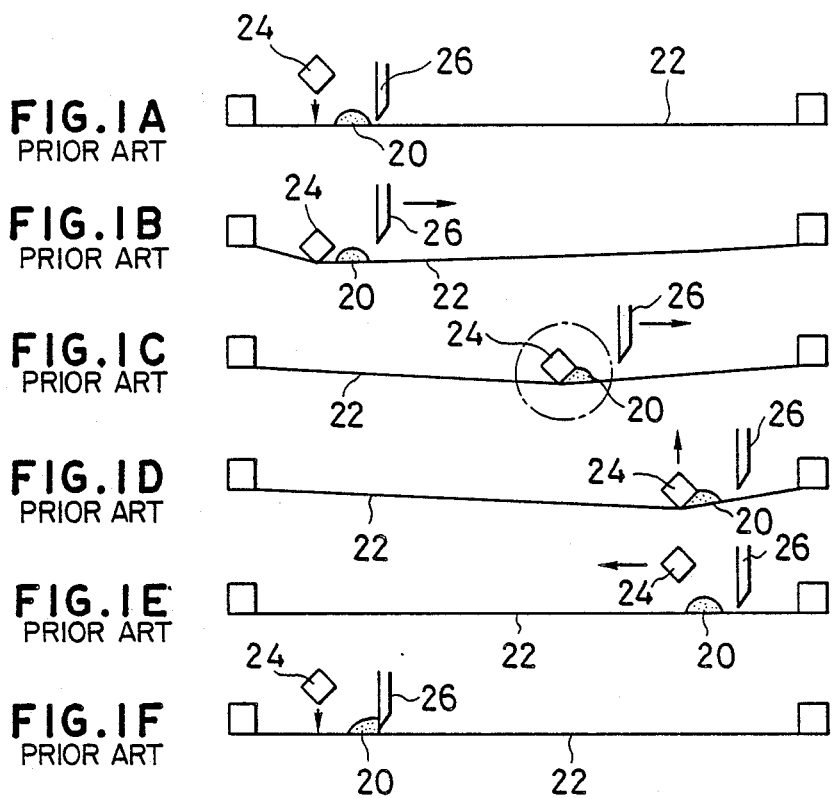
FIG.1A PRIOR ART
FIG.1B PRIOR ART
FIG.1C PRIOR ART
FIG.1D PRIOR ART
FIG.1E PRIOR ART
FIG.1F PRIOR ART
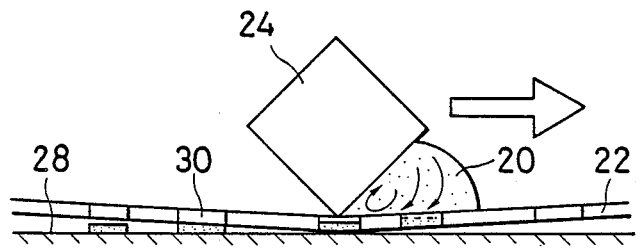
FIG.2 PRIOR ART

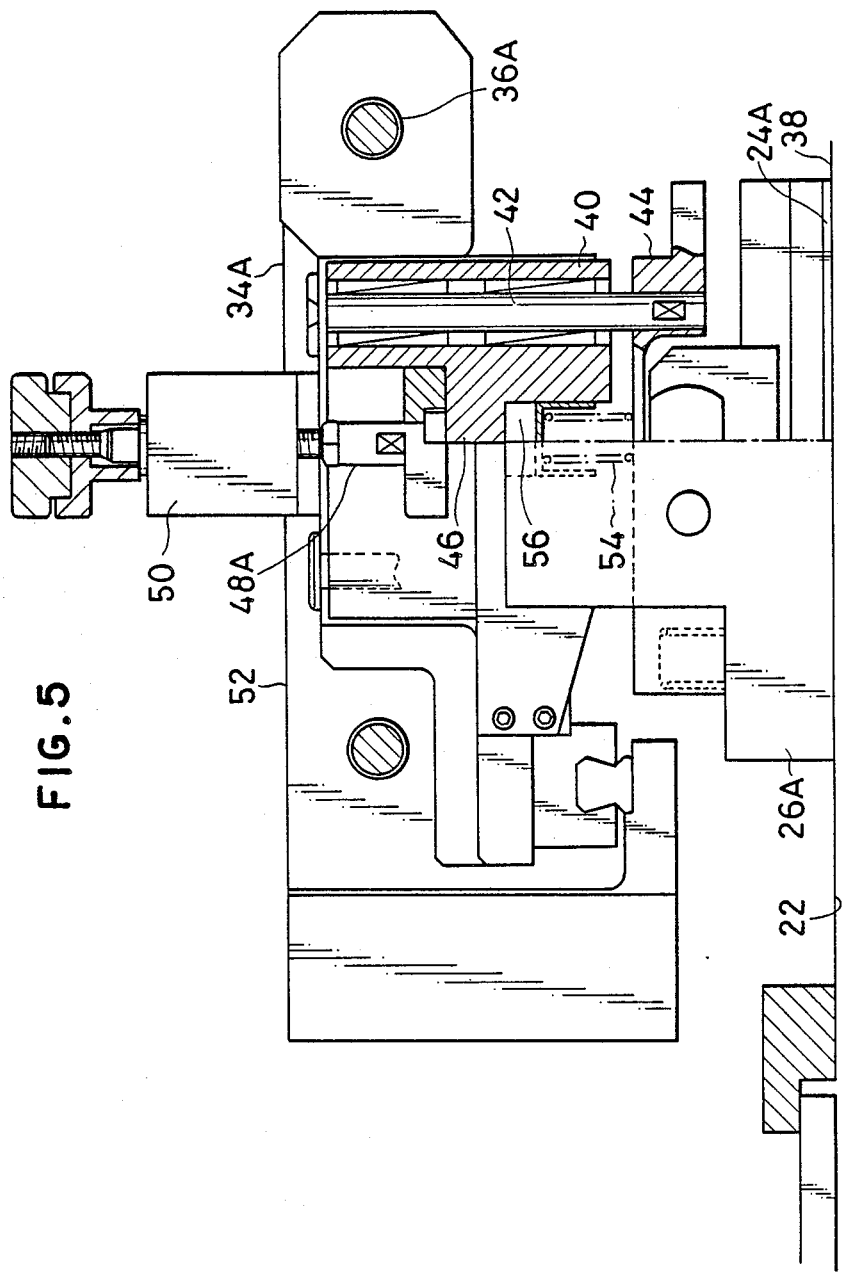

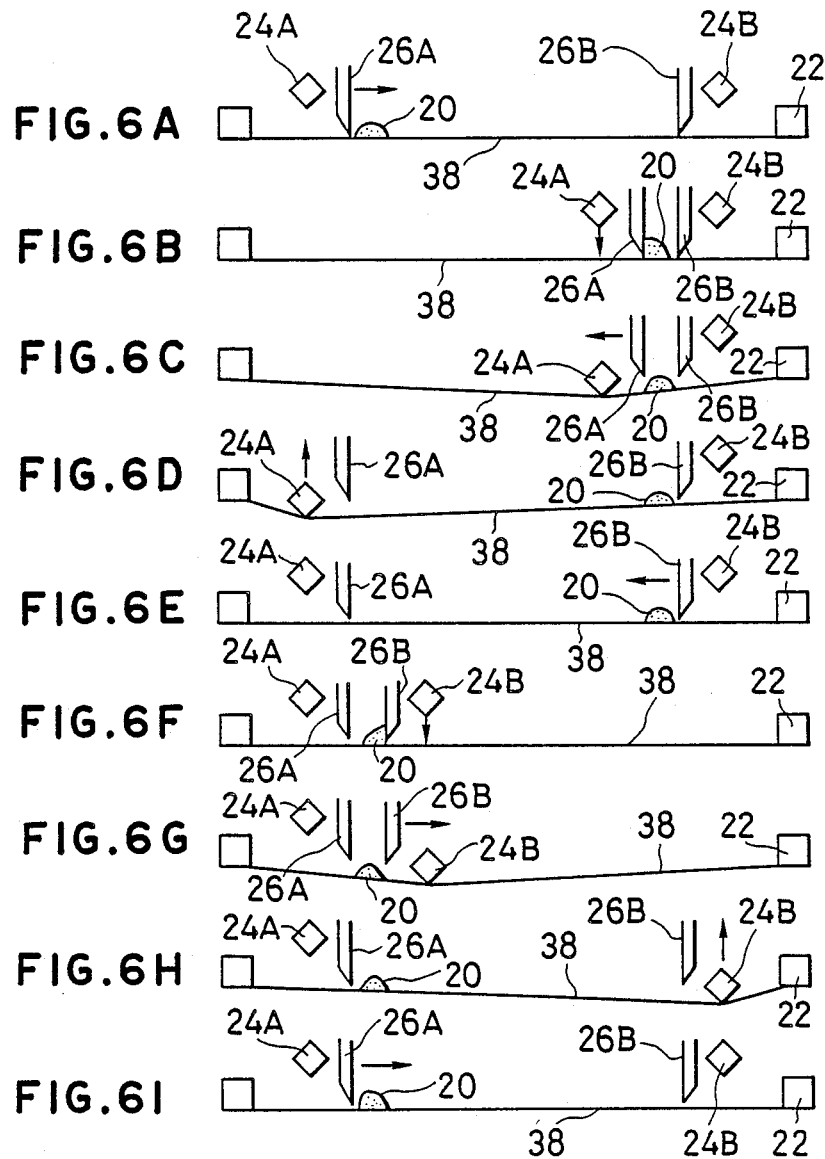

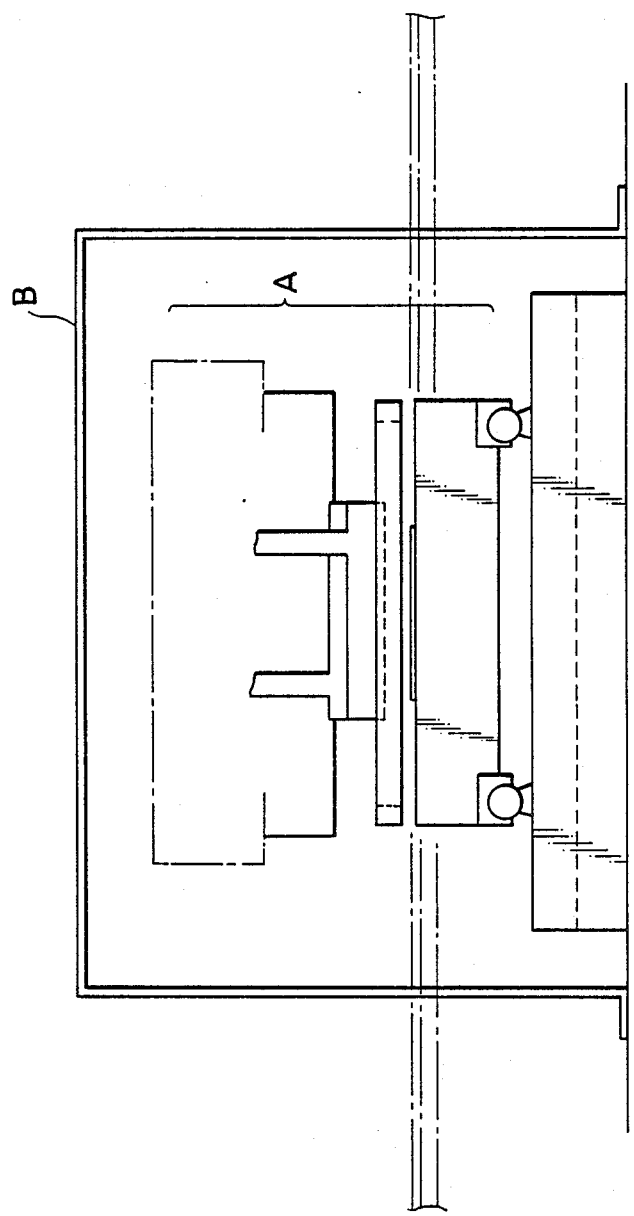

SCREEN PRINTER WITH DOUBLE DOCTOR/SQUEEGEE, PRINTING PRESSURE SENSOR AND ALIGNING MECHANISM

BACKGROUND OF THE INVENTION

1. Field of the Invention

This invention relates to a screen printing method and an apparatus therefor, and more particularly to a screen printing method which is adapted to print a pattern on an object to be subjected to printing such as a substrate for a printed wiring board or the like and an apparatus therefor.

2. Description of the Prior Art

Conventionally, screen printing has been typically carried out using a screen printing apparatus including a single printing head provided with a single doctor plate (ink return) and a single squeegee in such a manner as shown in FIGS. 1 and 2. More particularly, FIG. 1A shows a state that a paste 20 on a screen 22 has been returned to a leftmost position on the screen 22 adjacent to a squeegee 24 by means of a doctor plate 26. Then, the squeegee 24 is lowered to downwardly force the screen 22 against an object to be subjected to printing (hereinafter referred to as "printed object") 28 (FIG. 2) such as a substrate for a printed wiring board made of alumina or the like as shown in FIG. 1B. Thereafter, the printing head is laterally moved to cause the squeegee 24 to be moved laterally or in a right-hand direction while pressing the screen against the printed object and moving the paste as shown in FIGS. 1C and 1D, resulting in printing on the printed object.

More particularly, as shown in FIG. 2 which enlargedly shows a portion of FIG. 1C surrounded by dashed lines, movement of the squeegee 24 in a direction indicated at an arrow while pressing the screen 22 against the printed object 28 causes the paste 20 to be printed on the printed object or substrate 28 via fine through-holes 30 constituting a printing pattern of the screen 22, resulting in a printed pattern being formed on the substrate 28.

Thus, when the squeegee 24 is moved to a rightmost position on screen 22 as shown in FIG. 1D, the squeegee 24 is raised to be separated from the screen 22 as shown in FIGS. 1D and 1E and then returned to the original position as shown in FIG. 1E and 1F. Simultaneously, the doctor plate 26 transfers the paste 20 to the leftmost position on the screen 22 as shown in FIG. 1F. Simultaneously, the squeegee 24 is returned to the original position.

Unfortunately, in the conventional screen printing described above, the doctor plate 26 merely acts to return the paste 20 toward the squeegee 24, accordingly, the squeegee 24 transfers the paste 20 while carrying out printing of the paste 20 on the board 28. This causes the paste 20 transferred with movement of the squeegee 24 to be varied in an amount as it is transferred, so that a thickness of a film of the paste 20 printed on the screen 22 is varied and the paste 20 is excessively deposited on the substrate 28. Such disadvantages substantially interfere with fining of a printed pattern on the substrate and formation of a fined pattern.

The conventional screen printing has another disadvantage that printing pressure which the printed object or substrate 28 receives is gradually increased as printing operation is repeated, because tension of the screen 22 is decreased with repeat of the printing operation even when squeegee pressure at which the squeegee 24 presses the screen 22 and substrate 28 is kept constant in the case that the squeegee 24 presses the screen 22 against the substrate 28 to deposit the paste 20 onto the substrate 28 while transferring the paste.

Further, the conventional screen printing fails to directly monitor the printing pressure, accordingly, it is conventionally carried out to replace the screen when it is deteriorated to a degree sufficient to decrease its tension.

However, it is now highly desired to fine a printed pattern or form a fine pattern. This requires a thickness of a printed pattern to be rendered more uniform. For this purpose, it is required to keep the printing pressure within a predetermined range. Unfortunately, the conventional screen printing does not meet the requirements because it fails to directly control the printing pressure as described above.

Furthermore, the conventional screen printing needs that aligning of the screen is carried out at every replacement of the screen. More specifically, proof printing must be carried out at every replacement of the screen in order to determine whether a printing pattern formed on the screen is properly positioned with respect to the substrate. As a result, when the positioning is improper, it is required to carry out positional correction of the screen and substrate in relation to each other. Thus, the conventional screen printing is highly troublesome and requires much time and labor.

SUMMARY OF THE INVENTION

The present invention has been made in view of the foregoing disadvantages of the prior art.

Accordingly, it is an object of the present invention to provide a screen printing method which is capable of printing a paste on a printed object at a uniform thickness to accomplish fining of a printed pattern and formation of a fined printed pattern.

It is another object of the present invention to provide a screen printing method which is capable of uniformly applying a paste onto a screen prior to printing the paste on a printed object, to thereby permit the paste to be printed on the printed object at a uniform thickness.

It is a further object of the present invention to provide a screen printing method which is capable of keeping printing pressure within a predetermined range to apply a paste onto a printed object at a uniform thickness.

It is still another object of the present invention to provide a screen printing method which is capable of efficiently carrying out screen printing operation.

It is yet another object of the present invention to provide a screen printing method which is capable of readily attaining aligning of a screen during replacement of the screen.

It is even another object of the present invention to provide a screen printing apparatus which is capable of printing a paste on a printed object at a uniform thickness to accomplish fining of a printed pattern and formation of a fined printed pattern.

It is still a further object of the present invention to provide a screen printing apparatus which is capable of keeping printing pressure within a predetermined range to apply a paste onto a printed object at a uniform thickness.

It is yet a further object of the present invention to provide a screen printing apparatus which is capable of efficiently carrying out screen printing operation.

It is an even further object of the present invention to provide a screen printing apparatus which is capable of readily attaining aligning of a screen during replacement of the screen.

In accordance with one aspect of the present invention, a screen printing method is provided. In the method, doctor plate means is moved in a predetermined direction on a screen to apply a paste onto the screen. Then, squeegee means is moved to cause the paste applied onto the screen to be deposited on a printed object while pressing the screen against the printed object at a predetermined squeegee pressure.

In accordance with another aspect of the present invention, a screen printing apparatus is provided. The apparatus includes a screen and a pair of printing heads alternately actuated for printing. The printing heads each are arranged above the screen so as to be laterally movable with respect to the screen and include a doctor plate mounted on the printing head and a squeegee vertically movably mounted on the printing head. The doctor plates of the printing heads are arranged laterally opposite to each other on the screen. The doctor plates each serve to apply a paste onto the screen while transferring the paste and the squeegees each serve to press the screen against a printed object after application of the paste onto the screen by the doctor plate corresponding thereto.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIGS. 1A to 1F are schematic views illustrating the steps of conventional screen printing;

FIG. 2 is an enlarged schematic view of a part surrounded by dash lines in FIG. 1C showing the manner of printing a paste on a board in conventional screen printing;

FIG. 5 is a sectional side elevation view of the part shown in FIG. 4;

FIGS. 6A to 6I are schematic views showing a procedure of operation of the screen printing apparatus shown in FIG. 3;

FIG. 7 is a schematic view showing an arrangement suitable for controlling a temperature of a printing section of the screen printing apparatus shown in FIG. 3;

DETAILED DESCRIPTION OF THE PREFERRED EMBODIMENTS

Now, a screen printing method and an apparatus therefor according to the present invention will be described hereinafter with reference to FIGS. 3 to 19.

Figure 3:
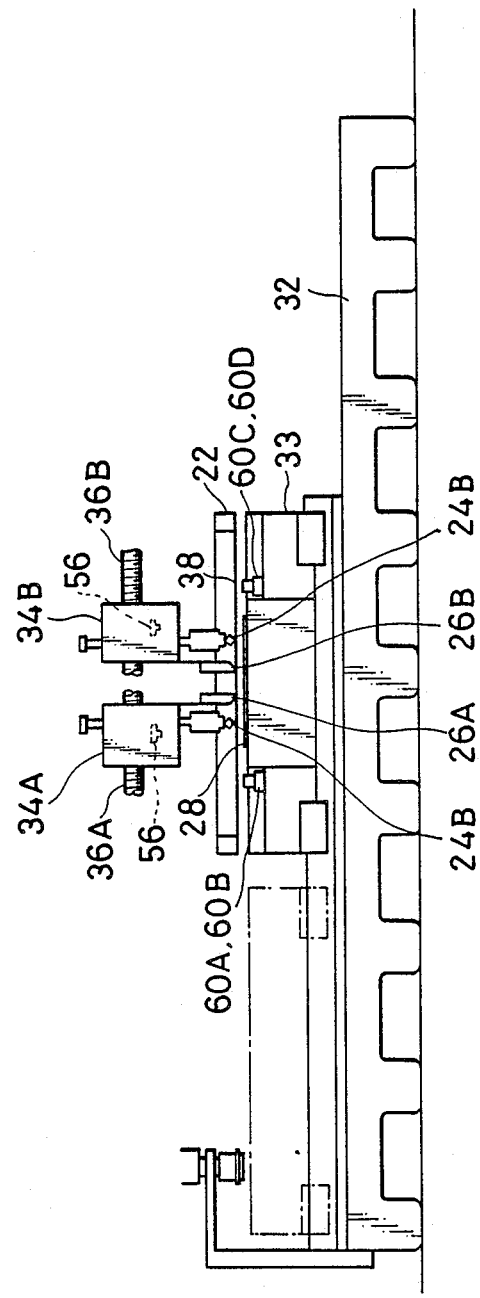
FIG. 3 is a front elevation view showing an embodiment of a screen printing apparatus according to the present invention.

FIG. 3 generally shows an embodiment of a screen printing apparatus according to the present invention. A screen printing apparatus of the illustrated embodiment includes a surface plate 32 which is so formed that it has a horizontal upper surface of good flatness. On the surface plate 32 is arranged an $X-Y-\theta$ table 33, on which a substrate 28 for a printed wiring board to be subjected to printing which is a printed object is horizontally positioned. The substrate 28 may be formed of alumina or the like.

The screen printing apparatus of the illustrated embodiment also includes a screen 22 horizontally supported at a position slightly upwardly spaced from the substrate 28. The screen 22 is formed with fine throughholes which constitute a printing pattern of the screen 22 and are arranged to obtain a desired printed pattern when a printing operation is carried out. Above the screen 22 are disposed two printing heads 34A and 34B which are movably supported on ball screws 36A and 36B so as to be slidable thereon in a lateral direction, respectively.

Figure 4:
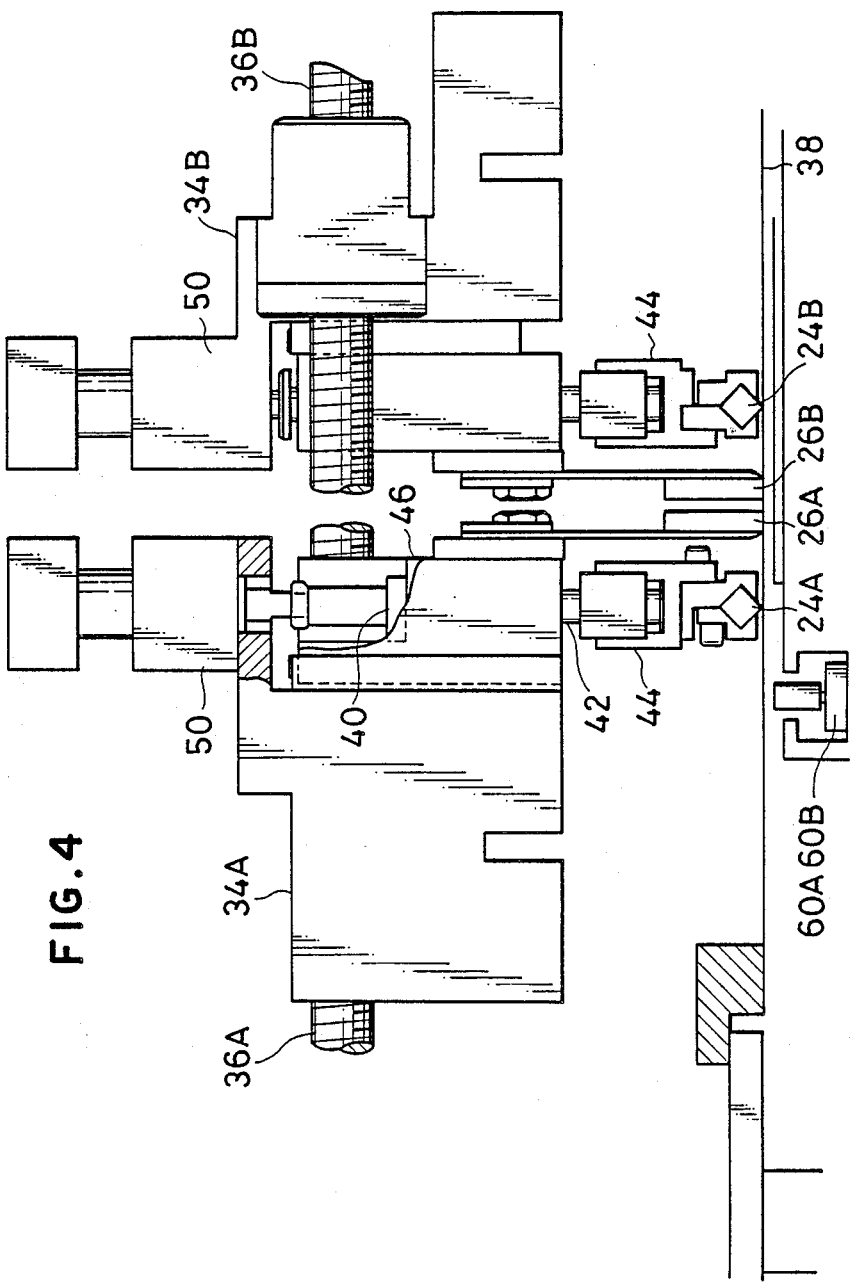
FIG. 4 is a front elevation view partly in section showing an essential part of the screen printing apparatus shown in FIG. 3.

As shown in FIGS. 4 and 5, the left printing head 34A includes a left doctor plate 26A fixed on the printing head 34A so that a lower end thereof is on substantially the same level as a surface 38 of the screen 22 and a left squeegee 24A vertically movably mounted on the printing head 34A by means of a ball bush 40. More particularly, the squeegee 24A is fixed on a slide shaft 42 of the ball bush 40 through a mounting member 44 and a vertically movable block 46 formed integral with the ball bush 40 is connected to a drive shaft of an air cylinder 50 fixed on a frame 52 of the printing head 34A. Between the vertically movable block 46 and the mounting member 44 are arranged a compression spring 54 and a pressure sensor 56 for detecting pressure of the squeegee 24. The words "pressure of squeegee" or "squeegee pressure" used herein indicate pressure at which the squeegee 24 presses the screen 22 and substrate 28. Thus, in the illustrated embodiment, extension of the drive shaft 48A of the air cylinder 50 causes the vertically movable block 46 to be vertically moved. Such movement of the block 46 is then transmitted through the compression spring 54 to the mounting member 44, so that the left squeegee 24A downwardly forces the screen 22 against the substrate 28 at predetermined squeegee pressure.

The right printing head 34B includes a right doctor plate 26B fixed on the printing head 34B so that a lower end thereof may be on substantially the same level as the surface 38 of the screen 22 and a right squeegee 24B vertically movably mounted on the printing head 34B. The right doctor plate 26B and squeegee 24B are arranged in a manner to be positionally symmetric with respect to the left doctor plate 26A and squeegee 24A. Also, the doctor plates 26A and 26B are arranged laterally directly opposite to each other.

Now, the manner of operation of the screen printing apparatus of the illustrated embodiment constructed as described above will be described with reference to FIG. 6.

First, as shown in FIG. 6A, the left doctor plate 26A transfers a paste (ink) 20 put on the surface 38 of the screen 22 in a right direction as indicated at an arrow to uniformly apply it onto the screen 22, during which the left squeegee 24A is moved in the right direction while being kept upwardly separated from the screen. Then, the left squeegee 24A is lowered as indicated at an arrow in FIG. 6B and moved in a left direction while pressing the screen 22 against a printed object or substrate (not shown) at predetermined squeegee pressure as shown in FIG. 6C, during which the doctor plate 26A is moved in the same direction with movement of the squeegee 24A while being kept upwardly separated from the screen 22. This causes the paste 20 applied onto the screen 22 to be forcedly downwardly deposited on the substrate through a predetermined printing pattern formed on the screen 22 at the predetermined squeegee pressure, resulting in a desired printed pattern being formed on the substrate. Thus, it will be noted that the illustrated embodiment permits a printed pattern of high quality to be formed on the substrate, because it effectively prevents the paste 20 from being excessively present in a direction of movement or advance of the squeegee. Then, the left squeegee 24A which reached a leftmost position on the screen 22 is raised as indicated at an arrow in FIG. 6D, resulting in first printing operation being completed.

Subsequently, the right printing head carries out a second printing operation. First, as shown in FIG. 6E, the right doctor plate 26B transfers the paste 20 in the left direction as indicated at an arrow to uniformly apply it onto the screen 22, during which the right-hand squeegee 24B is moved with movement of the doctor plate 26B while being kept upwardly separated from the screen. Then, the squeegee 24B is downwardly moved as indicated at an arrow in FIG. 6F and then moved in the right direction while pressing the screen 22 against the substrate at predetermined pressure as shown in FIG. 6G. This causes the paste 20 applied onto the screen 22 to be forcedly downwardly deposited on the substrate through the predetermined printing pattern of the screen 22 at the predetermined squeegee pressure, resulting in desired printed pattern being formed on the substrate. Then, the right squeegee 24B which reached a rightmost position on the screen 22 is raised as indicated at an arrow in FIG. 6H, resulting in the second printing operation being completed. Thereafter, the left printing head is actuated to repeat such printing operation as described above, as shown in FIG. 6I.

As described above, in the illustrated embodiment, a pair of the doctor plates 26 opposite to each other repeatedly transfer the paste 20 to apply it onto the screen 22, resulting in the paste being effectively prevented from being excessively present in the direction of advance of each of the squeegees 24. Also, the squeegees 24 each merely serve to press the paste applied onto the screen against the substrate. Thus, it will be noted that the illustrated embodiment eliminates disadvantages of the prior art such as a variation of a thickness of a printed pattern, adhesion of excessive paste on a printed object and the like which are caused due to transfer of a paste by a squeegee, to thereby accomplish fining of a printed pattern formed on the substrate.

In the illustrated embodiment, as shown in FIG. 7, a printing section A of the apparatus including the $X-Y-\theta$ table 33, printed object 28, screen 22, printing heads 34 and the like may be put in a thermostatic chamber B to keep viscosity of the paste constant, so that a variation in the thickness of a printed pattern formed on the substrate may be further prevented irrespective of a variation in the temperature of an external atmosphere. Local use of such a thermostatic chamber eliminates use of a dry oven or the like which is required to keep a temperature of a space or room in which the whole screen printing apparatus is arranged constant, resulting in the space being effectively utilized.

As can be seen from the foregoing, the illustrated embodiment is so constructed that each of the doctor plates previously uniformly apply the paste on the screen and the squeegees each merely function to pressingly deposit the paste applied onto the screen on a printed object without transferring the paste, to thereby prevent paste from being excessively present in the direction of advance of the squeegee. Such construction permits a printed pattern to be formed on the substrate at a uniform thickness, to thereby accomplish fining of the printed pattern.

The illustrated embodiment may be constructed so as to vary squeegee pressure depending on a variation of tension of the screen to keep printing pressure in a predetermined range while detecting squeegee pressure and printing pressure, to thereby render a thickness of a printed pattern more uniform.

Figure 8A:
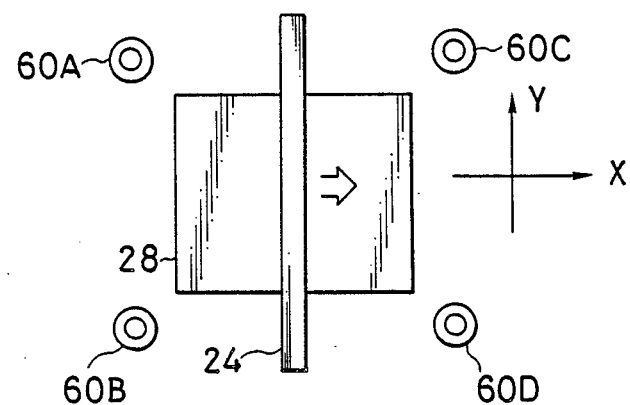
FIG. 8A is a plan view showing a printing pressure control mechanism.
Figure 8B:
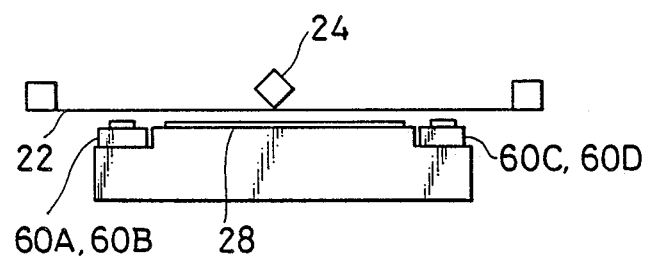
FIG. 8B is a front elevation view of the printing pressure control mechanism shown in FIG. 8A.

For this purpose, the screen printing apparatus, as shown in FIGS. 8A and 8B, may include a plurality of pressure sensors 60 provided at predetermined positions on the $X-Y-\theta$ table 33 on which the substrate 28 is put. In the illustrated embodiment, four such pressure sensors 60a to 60d are provided on the table 33 in a manner to positionally correspond to four corners of the substrate 28 and be separated at a suitable distance therefrom. The pressure sensors 60A to 60D each are so arranged that a pressure detecting surface thereof is flush with an upper surface of the substrate 28.

Figure 9:
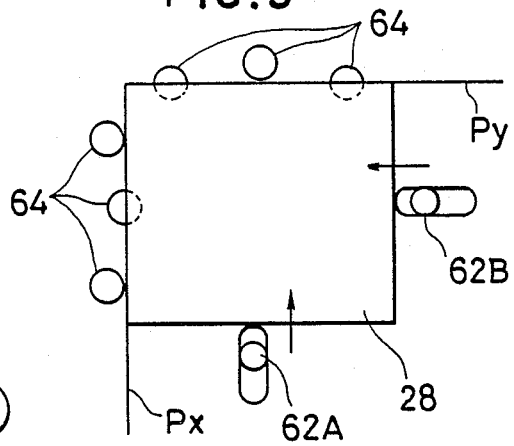
FIG. 9 is a plan view showing a mechanism for aligning a printed object.
Figure 10:
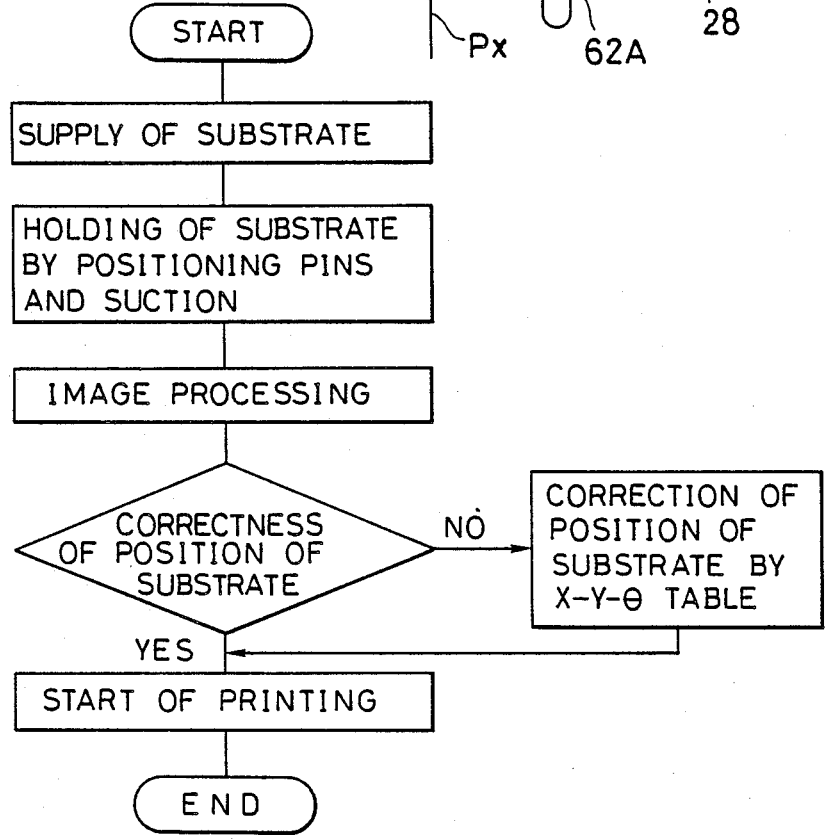
FIG. 10 is a flow chart showing a procedure of operation of the printed object aligning mechanism of FIG. 9.

The screen printing apparatus also may include an indexing or aligning mechanism for accurately positioning the printed object or substrate 28 on the $X-Y-\theta$ table 33, as schematically shown in FIG. 9. The aligning mechanism includes positioning pins 62A and 62B arranged so as to be movable by a predetermined distance in X and Y directions with respect to the table 33, respectively. The pins 62A and 62B serve to properly position the substrate 28 on the table 33 along datum planes Px and Py predetermined in X and Y directions on the table 33, respectively. The substrate 28 is then securely held by suction. The aligning mechanism also includes cameras arranged so as to upwardly view edges of the substrate 28 to determine whether the edges are aligned with the datum planes Px and Py. An image obtained by the cameras 64 may be suitably processed to determine deviation of the substrate from the datum planes.

When the substrate 28 is supplied to the $X-Y-\theta$ table 33 by means of a transfer mechanism (not shown), the table 33 is moved to a positioning station as indicated at dotted lines in FIG. 3. Then, the aligning mechanism shown in FIG. 9 carries out positioning of the substrate 28 on the $X-Y-\theta$ table 33 according to a procedure shown in FIG. 10. More particularly, the positioning pins 62 abut the substrate 28 against the datum planes Px and Py, which is then held at a predetermined position by suction. Then, the edges of the substrate 28 are upwardly viewed through each of the cameras 64, of which an image is processed to determine deviation ($\Delta X$, $\Delta Y$ and $\Delta\theta$) of the substrate from a reference position. Thereafter, the deviation is corrected by movement of the $X-Y-\theta$ table 33, which is then transferred to a printing station as indicated at solid lines in FIG. 3.

Such alignment of the substrate 28 as described above is for the purpose of eliminating misregistration between printed paste layers due to a failure in positioning of the substrate 28. This leads to manufacturing of a product or printed wiring board of higher reliability.

Figure 11:
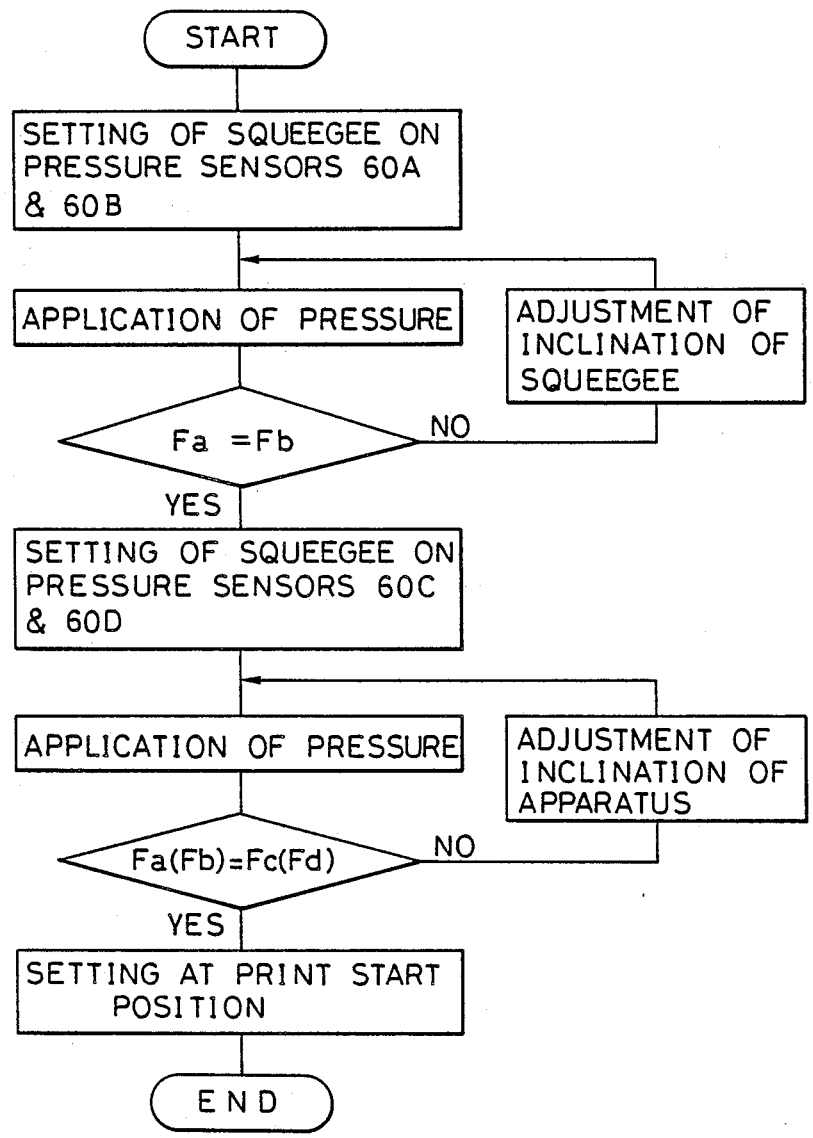
FIG. 11 is a flow chart showing a procedure of operation for correcting position of a squeegee prior to screen printing.

Subsequently, correction of inclination of the squeegees 24A and 24B, and parallelism between travelling of the printing heads 34A and 34B provided with the squeegees 24A and 24B and the $X-Y-\theta$ table 33 on which the substrate 28 is put are carried out by means of the correction mechanism shown in FIG. 8 according to a procedure shown in FIG. 11.

First, the squeegee 24A is set on the pressure sensors 60A and 60B and then lowered to apply pressure to the sensors. At this time, when pressures Fa and Fb applied to the pressure sensors 60A and 60B are the same, this means that inclination of the squeegee 24A is zero; whereas any difference between both pressures Fa and Fb indicates that the squeegee 24A inclines, accordingly, inclination of the squeegee 24A is corrected so that both pressures Fa and Fb may be equal to each other.

Then, the squeegee 24A is set on the pressure sensors 60C and 60D and then lowered to apply pressure to both sensors. When pressure Fc applied to the pressure sensor 60C is the same as the above-described pressure Fa applied to the pressure sensor 60A or pressure Fd applied to the pressure sensor 60D is the same as the above-described pressure Fb applied to the sensor 60B (Fa=Fc or Fb=Fd), this indicates that the printing head 34A is kept parallel with respect to the upper surface of the $X-Y-\theta$ table 33; whereas Fa$\neq$Fc or Fb$\neq$Fd means that the table 33 and printing head 34A are not parallel to each other, accordingly, the table 33 or printing head 24A is selectively adjusted to obtain Fa=Fc or Fb=Fd.

The above procedures are similarly applied to the squeegee 24B and printing head 34B.

Thus, printing pressure which the substrate 28 receives through the screen 22 from the squeegee 24 is kept constant while the squeegee is travelling on the screen, so that a printed pattern of a uniform thickness may be obtained. Then, the printing operation described above with reference to FIGS. 6A to 6I may be carried out.

Squeegee pressure F1 which each of the squeegees 24A and 24B applies to the screen 22 and substrate 28, printing pressure F2 which the substrate 28 receives (corresponding to Fa to Fd detected by the printing pressure control mechanism of FIG. 8) and tension F3 of the screen 22 establish a relationship F1=F2+F3. Tension F3 of the screen 22 gradually decreases as the screen printing operation is repeated, accordingly, setting of the squeegee pressure F1 at a constant level causes the printing pressure F2 to gradually increase with repeat of the printing operation.

Figure 12:
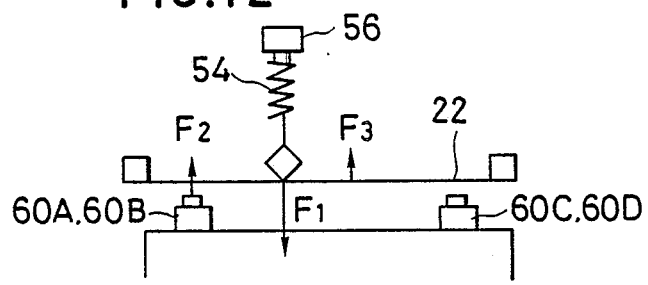
FIG. 12 is a schematic view showing a squeegee pressure control mechanism.
Figure 13:
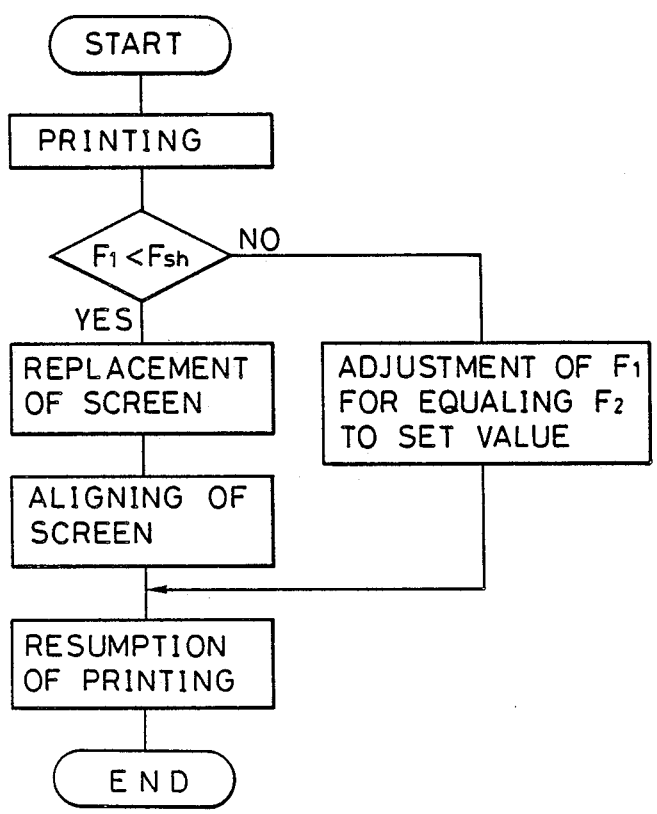
FIG. 13 is a flow chart showing a procedure of operation of the squeegee pressure control mechanism shown in FIG. 12.

In order to avoid such a problem, the screen printing apparatus of the illustrated embodiment may employ a squeegee pressure control mechanism shown in FIG. 12, which is adapted to variably control the squeegee pressure F1 according to a procedure shown in FIG. 13 to compensate a decrease in tension of the screen, resulting in the printing pressure being kept within a predetermined range.

Detection of the squeegee pressure F1 by the mechanism of FIG. 12 is carried out by the pressure sensor 56 which receives pressure or force and the printing pressure F2 is detected utilizing the pressure sensors 60A to 60D (FIG. 8) each having the pressure detecting surface flush with the upper surface or printed surface of the substrate 28 as described above.

Figure 14A:
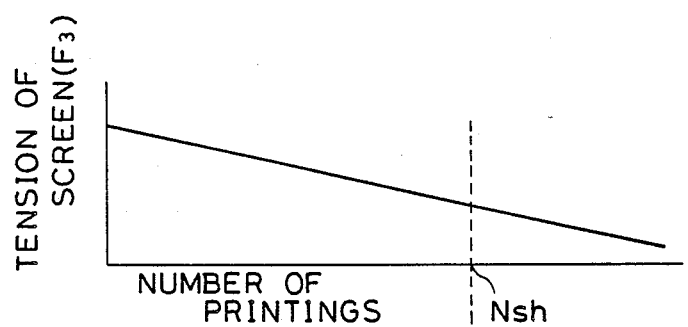
FIG. 14A is a graphical representation showing a relationship between the number of printings and tension of a screen.
Figure 14B:
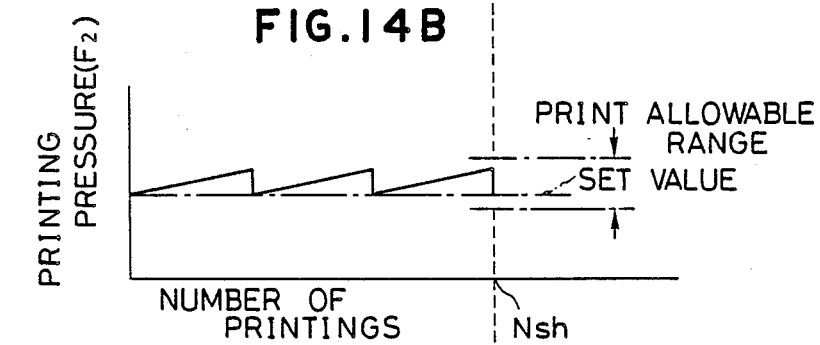
FIG. 14B is a graphical representation showing a relationship between the number of printings and printing pressure.
Figure 14C:
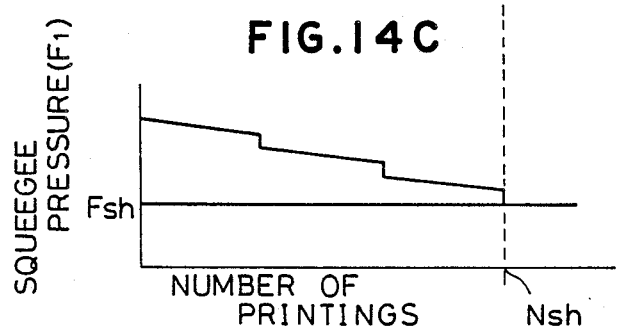
FIG. 14C is a graphical representation showing a relationship between the number of printings and squeegee pressure.

Control of the squeegee pressure by the mechanism of FIG. 12 is carried out according to a procedure shown in FIG. 13. More particularly, comparison between the actual squeegee pressure F1 at the time of printing and predetermined squeegee pressure Fsh which is a value of F1 obtained at the time when the screen 22 reaches print limit tension or a possible minimum value of F1 is carried out. When F1 is not less than Fsh (F1>Fsh), F1 is adjusted so that the printing pressure F2 may be equal to a set value. More specifically, tension F3 of the screen, as shown in FIG. 14A, decreases as printing operation is repeated; accordingly, in order to cause the printing pressure F2 to be within a print allowing range as shown in FIG. 14B, it is required to decrease the squeegee pressure F1 as the printing operation is repeated as shown in FIG. 14C.

Thus, a decrease in F1 for the purpose of compensating a decrease in F3 finally causes F1 to be less than Fsh (F1<Fsh) when the printing operation is repeated Nsh times. At this time, the screen 22 is replaced with a new one and then its alignment is carried out for resumption of printing operation.

As described above, the construction detects the squeegee pressure at which the squeegee presses the screen and printed object and the printing pressure which the printed object receives and varies the squeegee pressure depending on a variation of tension of the screen to keep the printing pressure within a predetermined range. Accordingly, even when tension of the screen is varied as the printing operation is repeated, adjustment of the squeegee pressure permits the printing pressure to be kept substantially constant, so that a printed pattern of a uniform thickness may be obtained irrespective of repeated printing.

In a screen printing line, replacement of a screen (change of a printing pattern of a screen) is generally carried out according to the following procedure:

(1) Recovery of paste used;
(2) Cleaning or replacement of squeegee and doctor plate;
(3) Replacement of screen;
(4) Aligning of screen;
(5) Setting of printing pressure;
(6) Supply of fresh paste; and
(7) Proof printing.

As is obvious to those skilled in the art, it takes much time to practice the procedure. In particular, repeated replacement of the screen causes operating efficiency in the printing line to be substantially reduced. This is remarkable particularly in the case of diversified small-quantity production.

Figure 15:
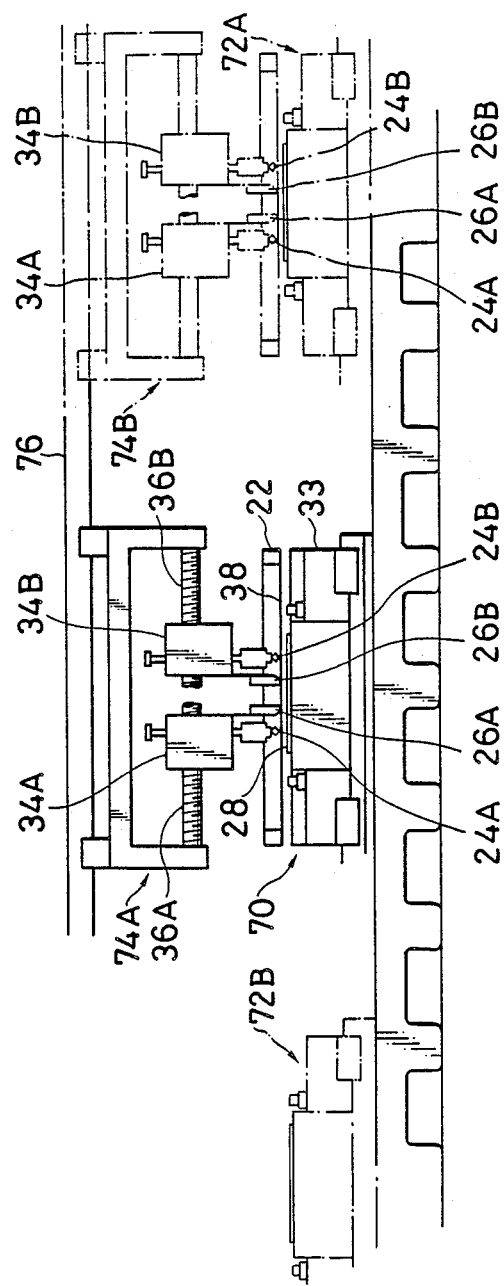
FIG. 15 is a front elevation view showing another embodiment of a screen printing apparatus according to the present invention.

FIG. 15 shows another embodiment of a screen printing apparatus according to the present invention which is adapted to eliminate the above-noted problem. A screen printing apparatus of the embodiment includes, in addition to a printing station 70 for practically carrying out printing operation which includes a screen 22 and an $X-Y-\theta$ table 33, a pair of arrangement stations 72A and 72B provided on both sides of the printing station 70 as indicated at dash lines in FIG. 15. Also, the apparatus of the embodiment includes two sets or pairs of printing heads 34A and 34B which are supported on head frames 74A and 74B arranged so as to be horizontally movable on a rail 76, respectively. Such construction in the embodiment, while one set or pair of the printing heads 34A and 34B supported on one head frame 74A are practicing printing on a substrate 28 at the printing station 70, causes the other head frame 74B to be moved to the arrangement station 72A or 72B on which a dummy substrate having the same configuration as the substrate 28 is put, so that the other set or pair of the printing heads 34A and 34B supported on the other head frame 74B may carry out the above-described steps (1) to (7) with respect to a screen formed with a pattern necessary for next printing. Thus, in the embodiment, the screen replacement operation needs only enough time for movement of the head frame 74B to the printing station 70 and alignment of the former with respect to the latter, so that it may be readily accomplished in a short period of time.

The remainder of the embodiment of FIG. 15 may be constructed in substantially the same manner as the embodiment described above.

Figure 16:
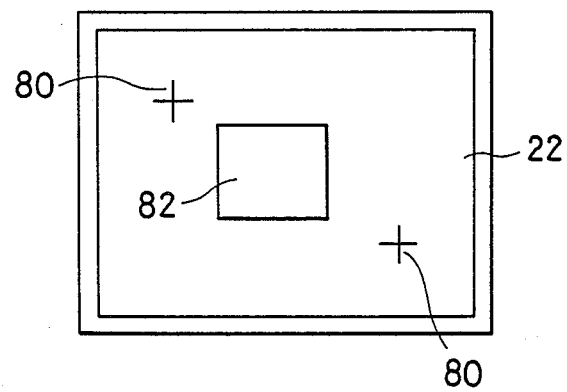
FIG. 16 is a plan view showing a screen used in a further embodiment of the present invention.
Figure 17:
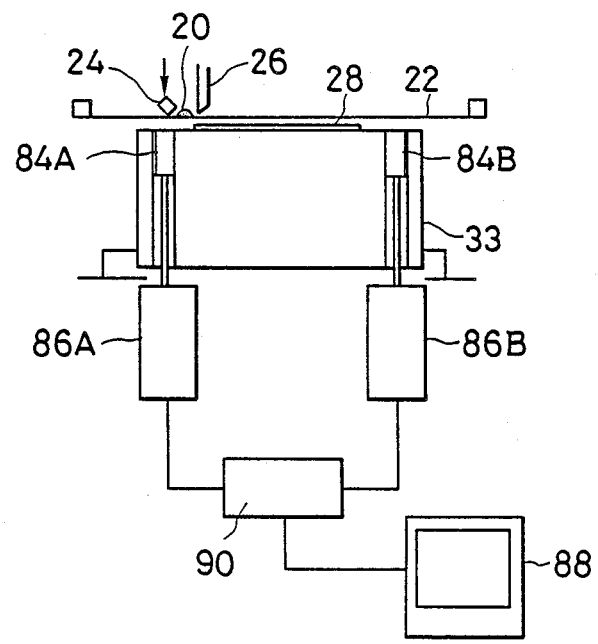
FIG. 17 is a fragmentary schematic front elevation view showing an essential part of the embodiment of FIG. 16.
Figure 18:
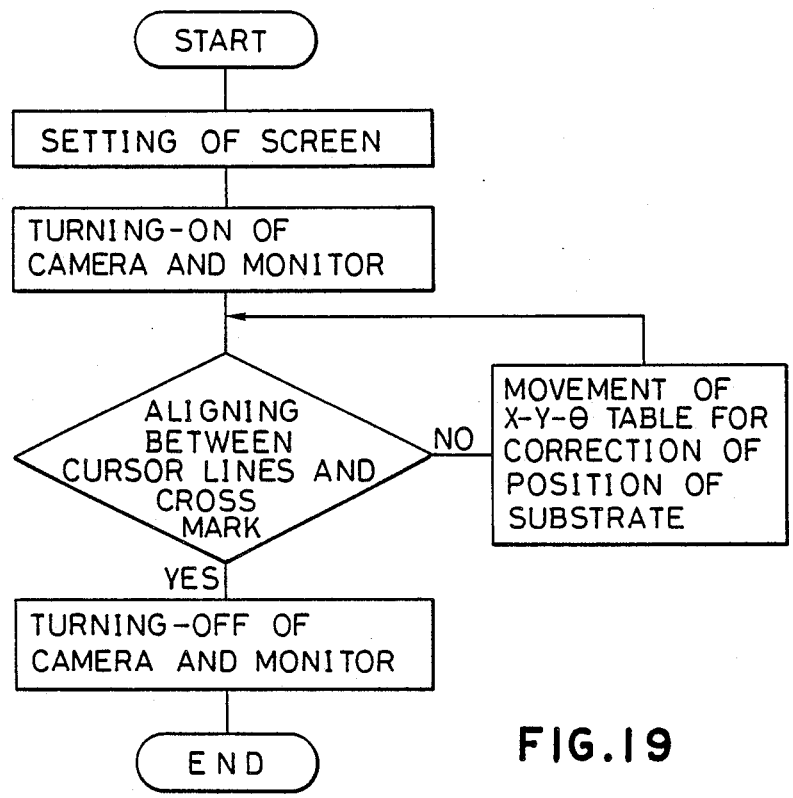
FIG. 18 is a flow chart showing a procedure of operation of the embodiment of FIG. 16.
Figure 19:
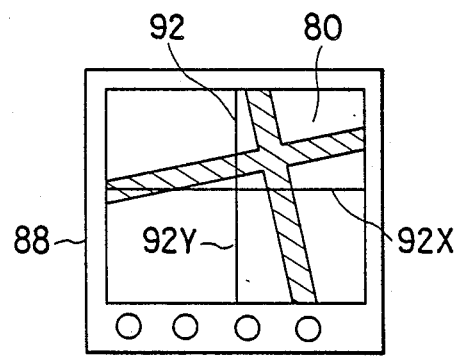
FIG. 19 is a schematic view showing an image plane of a TV monitor.

FIGS. 16 and 17 show a further embodiment of a screen printing apparatus according to the present invention. In FIG. 17, only a single doctor plate 26 and a single squeegee 24 are illustrated for clarity of description. A screen 22 is formed at one or more positions thereon with screen aligning marks 80 which, in the illustrated embodiment, comprise cross marks. Formation of the cross marks 80 may be carried out at the time of formation of a printing pattern 82 on the screen 22. In the illustrated embodiment, two such cross marks 80 are arranged on the screen 22 in a manner to be spaced from the printing pattern 82 and diagonally interpose the printing pattern 82 therebetween. This causes a positional relationship between the cross marks 80 and the printing pattern 82 to be defined with high accuracy.

The apparatus also includes an optical system which, in the illustrated embodiment, comprises TV camera lenses 84A and 84B which are connected to Tv camera bodies 86A and 86B through lens-barrels, optical fibers or the like, respectively. The lenses 84A and 84B are positioned vertically opposite to the cross marks 80 so as to upwardly view the marks 80 therethrough and fixed with respect to an $X-Y-\theta$ table 33. A video signal generated from each of the TV camera bodies 86A and 86B depending on images obtained through the lenses 84A and 84B is supplied to a TV monitor 88 through an image processor 90 which carries out operation of changing over TV cameras. The TV monitor 88 selectively displays images obtained through the TV lenses 84A and 84B.

Now, the manner of operation of the apparatus of the illustrated embodiment constructed as described above will be described hereinafter with reference to FIGS. 16 to 19.

First, a substrate 28 which is a printed object is put on the $X-Y-\theta$ table 33 and the screen 22 is set. Then, the TV cameras 86 and TV monitor 88 are turned on, so that datum lines or cursor lines 92 previously defined on an image plane of the TV monitor 88 and each of the screen aligning cross marks 80 may be displayed on the image plane. The cursor lines 92 comprise a horizontal cursor line 92X and a vertical cursor line 92Y. When the cursor lines 92 do not conform to the cross marks 80, the $X-Y-\theta$ table 33 is moved to correct position of the substrate 28 in relation to the screen 22 to complete aligning between the substrate 28 and the screen 22.

The remainder of the embodiment may be constructed in substantially the same manner as that shown in FIG. 3.

Such screen alignment described above accurately determines a positional relationship between the printing pattern 82 of the screen 22 and the printed object or substrate 28, so that proof printing during screen replacement may be eliminated to reduce a time required for the arrangement operation.

In the illustrated embodiment, the screen 22 and $X-Y-\theta$ table 33 are fixedly and movably arranged for screen alignment, respectively. However, when the substrate 28 is put on, for example, a stationary base, support means for the screen 22 may be provided with a position correcting device utilizing a screw or the like to correct position of the screen.

As described above, in the screen printing apparatus of the illustrated embodiment, the screen aligning marks are formed together with the printing pattern on the screen in a predetermined positional relationship to the printing pattern and displayed on the image plane through the cameras arranged in a predetermined positional relationship to the printed object, so that a relative positional relationship between the screen and the printed object may be corrected to align the screen aligning marks with the datum lines predetermined on the image plane. This causes the screen aligning to be readily accomplished to lead to a significant decrease in a time required for arrangement operation.

While preferred embodiment of the invention have been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. A screen printing apparatus comprising:
   a screen; and
   a pair of printing heads each arranged above said screen so as to be laterally movable with respect to said screen and each including a doctor plate mounted on said printing head and a squeegee vertically movably mounted on said printing head;

said printing heads being alternately actuated for printing;

said doctor plates of said printing heads being arranged laterally opposite to each other on said screen;

said doctor plates each applying a paste onto said screen while transferring said paste;

said squeegees each being moved while pressing said screen against a printed object after application of said paste onto said screen by said doctor plate corresponding thereto.

2. A screen printing apparatus as defined in claim 1 further comprising pressure detecting means for detecting squeegee pressure at which said squeegee presses said screen against said printed object and printing pressure which said printed object receives.

3. A screen printing apparatus as defined in claim 2, wherein said pressure detecting means comprises pressure sensors.

4. A screen printing apparatus as defined in claim 3, wherein said pressure sensors for detecting said printing pressure detect pressure at the same level as said printed object at positions adjacent to said printed object.

5. A screen printing apparatus as defined in claim 4, wherein said pressure sensors for detecting said printing pressure are arranged at a plurality of positions around said printed object.

6. A screen printing apparatus as defined in claim 1 further comprising a X−Y−θ table on which said printed object is put and a printed object aligning mechanism for aligning said printed object with a datum defined on said X−Y−θ table.

7. A screen printing apparatus as defined in claim 6, wherein said printed object aligning mechanism comprises positioning pins arranged so as to be movable in X and Y directions with respect to said X−Y−θ table, respectively.

8. A screen printing apparatus as defined in claim 1 further comprising a screen replacement mechanism.

9. A screen printing apparatus as defined in claim 8, wherein said screen replacement mechanism comprises:
a further pair of said printing heads;
a printing station on which printing operation is carried out; and
a pair of arrangement stations which are provided on both sides of said printing station and on which arrangements are carried out with respect to a screen to be replaced subsequently;
either said one pair of said printing heads or said further pair of said printing heads carrying out said arrangements on any one of said arrangement stations while either said further pair of printing heads or said one pair of said printing heads carry out printing operation on said printing station.

10. A screen printing apparatus comprising:
a screen;
a pair of printing heads each arranged above said screen so as to be laterally movable with respect to said screen and each including a doctor plate mounted on said printing head and a squeegee vertically movably mounted on said printing head;
said printing heads being alternately actuated for printing;
said doctor plates of said printing heads being arranged laterally opposite to each other on said screen;
said doctor plates each applying a paste onto said screen while transferring said paste;
said squeegees each being moved while pressing said screen against a printed object after application of said paste onto said screen by said doctor plate corresponding thereto; and
pressure detecting means for detecting squeegee pressure at which said squeegee presses said screen against said printed object and printing pressure which said printed object receives.

11. A screen printing apparatus comprising:
a screen;
a printing station on which printing operation is carried out;
a pair of arrangement stations which are provided on both sides of said printing station and on which arrangements are carried out with respect to a screen to be replaced subsequently; and
two pairs of printing heads, said printing heads each being arranged above said screen so as to be laterally movable with respect to said screen and each including a doctor plate mounted on said printing head and a squeegee vertically movably mounted on said printing head;
said printing heads of each of said two pairs of said printing heads being alternately actuated for printing;
said doctor plates of each of said two pairs of said printing heads being arranged laterally opposite to each other on said screen;
said doctor plates each applying a paste onto said screen while transferring said paste;
said squeegees each pressing said screen against a printed object after application of said paste onto said screen by said doctor plate corresponding thereto;
one of said two pairs of said printing heads carrying out said arrangements on any one of said arrangement stations while the other of said two pairs of said printing heads carries out printing operation on said printing station.

* * * * *